(12) United States Patent
Truskett et al.

(10) Patent No.: US 7,452,574 B2
(45) Date of Patent: Nov. 18, 2008

(54) METHOD TO REDUCE ADHESION BETWEEN A POLYMERIZABLE LAYER AND A SUBSTRATE EMPLOYING A FLUORINE-CONTAINING LAYER

(75) Inventors: Van N. Truskett, Austin, TX (US); Christopher J. Mackay, Austin, TX (US); B. Jin Choi, Round Rock, TX (US)

(73) Assignee: Molecular Imprints, Inc., Austin, TX (US)

( * ) Notice: Subject to any disclaimer, the term of this patent is extended or adjusted under 35 U.S.C. 154(b) by 427 days.

(21) Appl. No.: 10/375,817

(22) Filed: Feb. 27, 2003

(65) Prior Publication Data

US 2004/0170770 A1    Sep. 2, 2004

(51) Int. Cl.
*B05D 3/02* (2006.01)
(52) U.S. Cl. .................................. 427/387; 427/389.7
(58) Field of Classification Search .................. 427/387, 427/389.7
See application file for complete search history.

(56) References Cited

U.S. PATENT DOCUMENTS

| | | |
|---|---|---|
| 3,527,062 A | 9/1970 | Bilinski et al. |
| 3,783,520 A | 1/1974 | King |
| 3,807,027 A | 4/1974 | Heisler |
| 3,807,029 A | 4/1974 | Troeger |
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,267,212 A | 5/1981 | Sakawaki |
| 4,326,805 A | 4/1982 | Feldman et al. |

(Continued)

FOREIGN PATENT DOCUMENTS

DE    2800476    7/1978

(Continued)

OTHER PUBLICATIONS

Ross et al, Proceedings of SPIE—The International Society for Optical Engineering, 4343 (Emerging Lithographic Technologies V), pp. 427-435, 2001.*

(Continued)

*Primary Examiner*—Erma Cameron
(74) *Attorney, Agent, or Firm*—Fish & Richardson P.C.

(57) ABSTRACT

The present invention provides a method to reduce adhesion between a polymerizable layer and a substrate surface that selectively comes into contact with the polymerizable layer. The method features disposing a coating upon the surface from a composition having a perfluoro silane containing molecule. The perfluoro silane molecule is connected to bonding regions on the surface forming covalent bonding groups, as well as contact regions. The contact regions include fluorinated chains of molecules. The covalent bonding groups are positioned between the surface and the contact regions. The perfluoro silane containing molecule may be applied to the surface as a monomolecular layer from a di-functional perfluoro silane molecule. Exemplary molecules that may be employed as the perfluoro silane containing molecule includes molecules sold under the trade-names FLUOROSYL™ FSD 2500 and FLUOROSYL™ FSD 4500.

9 Claims, 6 Drawing Sheets

U.S. PATENT DOCUMENTS

| | | | |
|---|---|---|---|
| 4,337,579 A | 7/1982 | De Fazio | |
| 4,355,469 A | 10/1982 | Nevins et al. | |
| 4,414,750 A | 11/1983 | De Fazio | |
| 4,426,247 A | 1/1984 | Tamamura et al. | |
| 4,440,804 A | 4/1984 | Milgram | |
| 4,451,507 A | 5/1984 | Beltz et al. | |
| 4,507,331 A | 3/1985 | Hiraoka | |
| 4,544,572 A | 10/1985 | Sandvig et al. | |
| 4,552,832 A | 11/1985 | Blume et al. | |
| 4,552,833 A | 11/1985 | Ito et al. | |
| 4,600,309 A | 7/1986 | Fay | |
| 4,610,442 A | 9/1986 | Oku et al. | |
| 4,657,845 A | 4/1987 | Frechet et al. | |
| 4,687,707 A | 8/1987 | Matsuo et al. | |
| 4,692,205 A | 9/1987 | Sachdev et al. | |
| 4,694,703 A | 9/1987 | Routson | |
| 4,707,218 A | 11/1987 | Giammarco et al. | |
| 4,724,222 A | 2/1988 | Feldman | |
| 4,731,155 A | 3/1988 | Napoli et al. | |
| 4,737,425 A | 4/1988 | Lin et al. | |
| 4,763,886 A | 8/1988 | Takei | |
| 4,808,511 A | 2/1989 | Holmes | |
| 4,826,943 A | 5/1989 | Ito et al. | |
| 4,846,931 A | 7/1989 | Gmitter et al. | |
| 4,848,911 A | 7/1989 | Uchida et al. | |
| 4,857,477 A | 8/1989 | Kanamori | |
| 4,883,561 A | 11/1989 | Gmitter et al. | |
| 4,891,303 A | 1/1990 | Garza et al. | |
| 4,908,298 A | 3/1990 | Hefferon et al. | |
| 4,919,748 A | 4/1990 | Bredbenner et al. | |
| 4,921,778 A | 5/1990 | Thackeray et al. | |
| 4,929,083 A | 5/1990 | Brunner | |
| 4,931,351 A | 6/1990 | McColgin et al. | |
| 4,959,252 A | 9/1990 | Bonnebat et al. | |
| 4,964,945 A | 10/1990 | Calhoun | |
| 4,976,818 A | 12/1990 | Hashimoto et al. | |
| 4,980,316 A | 12/1990 | Huebner | |
| 4,999,280 A | 3/1991 | Hiraoka | |
| 5,053,318 A | 10/1991 | Gulla et al. | |
| 5,063,321 A | 11/1991 | Carter | |
| 5,071,694 A | 12/1991 | Uekita et al. | |
| 5,072,126 A | 12/1991 | Progler | |
| 5,073,230 A | 12/1991 | Maracas et al. | |
| 5,074,667 A | 12/1991 | Miyatake | |
| 5,108,875 A | 4/1992 | Thackeray et al. | |
| 5,110,514 A | 5/1992 | Soane | |
| 5,126,006 A | 6/1992 | Cronin et al. | |
| 5,148,036 A | 9/1992 | Matsugu et al. | |
| 5,148,037 A | 9/1992 | Suda et al. | |
| 5,151,754 A | 9/1992 | Ishibashi et al. | |
| 5,169,494 A | 12/1992 | Hashimoto et al. | |
| 5,173,393 A | 12/1992 | Sezi et al. | |
| 5,179,863 A | 1/1993 | Uchida et al. | |
| 5,198,326 A | 3/1993 | Hashimoto et al. | |
| 5,204,739 A | 4/1993 | Domenicali | |
| 5,206,983 A | 5/1993 | Guckel et al. | |
| 5,212,147 A | 5/1993 | Sheats | |
| 5,234,793 A | 8/1993 | Sebald et al. | |
| 5,240,550 A | 8/1993 | Boehnke et al. | |
| 5,240,878 A | 8/1993 | Fizsimmons et al. | |
| 5,242,711 A | 9/1993 | DeNatale et al. | |
| 5,244,818 A | 9/1993 | Jokerst et al. | |
| 5,259,926 A | 11/1993 | Kuwabara et al. | |
| 5,270,984 A | 12/1993 | Mine | |
| 5,277,749 A | 1/1994 | Griffith et al. | |
| 5,314,731 A | 5/1994 | Yoneda et al. | |
| 5,314,772 A | 5/1994 | Kozicki et al. | |
| 5,318,870 A | 6/1994 | Hartney | |
| 5,324,683 A | 6/1994 | Fitch et al. | |
| 5,328,810 A | 7/1994 | Lowrey et al. | |
| 5,330,881 A | 7/1994 | Sidman et al. | |
| 5,348,616 A | 9/1994 | Hartman et al. | |
| 5,362,606 A | 11/1994 | Hartney et al. | |
| 5,366,851 A | 11/1994 | Novembre | |
| 5,374,454 A | 12/1994 | Bickford et al. | |
| 5,376,810 A | 12/1994 | Hoenk et al. | |
| 5,380,474 A | 1/1995 | Rye et al. | |
| 5,392,123 A | 2/1995 | Marcus et al. | |
| 5,417,802 A | 5/1995 | Obeng | |
| 5,421,981 A | 6/1995 | Leader et al. | |
| 5,422,295 A | 6/1995 | Choi et al. | |
| 5,424,549 A | 6/1995 | Feldman | |
| 5,425,848 A | 6/1995 | Haisma et al. | |
| 5,425,964 A | 6/1995 | Southwell et al. | |
| 5,431,777 A | 7/1995 | Austin et al. | |
| 5,439,766 A | 8/1995 | Day et al. | |
| 5,452,090 A | 9/1995 | Progler et al. | |
| 5,453,157 A | 9/1995 | Jeng | |
| 5,458,520 A | 10/1995 | DeMercurio et al. | |
| 5,459,198 A * | 10/1995 | Sharp | 525/102 |
| 5,468,542 A | 11/1995 | Crouch | |
| 5,480,047 A | 1/1996 | Tanigawa et al. | |
| 5,482,768 A | 1/1996 | Kawasato et al. | |
| 5,512,131 A | 4/1996 | Kumar et al. | |
| 5,515,167 A | 5/1996 | Ledger et al. | |
| 5,523,878 A | 6/1996 | Wallace et al. | |
| 5,527,662 A | 6/1996 | Hashimoto et al. | |
| 5,545,367 A | 8/1996 | Bae et al. | |
| 5,566,584 A | 10/1996 | Briganti | |
| 5,633,505 A | 5/1997 | Chung et al. | |
| 5,654,238 A | 8/1997 | Cronin et al. | |
| 5,669,303 A | 9/1997 | Maracas et al. | |
| 5,670,415 A | 9/1997 | Rust | |
| 5,700,626 A | 12/1997 | Lee et al. | |
| 5,723,176 A | 3/1998 | Keyworth et al. | |
| 5,723,242 A * | 3/1998 | Woo et al. | 430/66 |
| 5,724,145 A | 3/1998 | Kondo et al. | |
| 5,725,788 A | 3/1998 | Maracas et al. | |
| 5,736,424 A | 4/1998 | Prybyla et al. | |
| 5,743,998 A | 4/1998 | Park | |
| 5,747,102 A | 5/1998 | Smith et al. | |
| 5,753,014 A | 5/1998 | Van Rijn | |
| 5,760,500 A | 6/1998 | Kondo et al. | |
| 5,772,905 A | 6/1998 | Chou | |
| 5,776,748 A | 7/1998 | Singhvi et al. | |
| 5,779,799 A | 7/1998 | Davis | |
| 5,802,914 A | 9/1998 | Fassler et al. | |
| 5,855,686 A | 1/1999 | Rust | |
| 5,877,036 A | 3/1999 | Kawai | |
| 5,877,861 A | 3/1999 | Ausschnitt et al. | |
| 5,888,650 A | 3/1999 | Calhoun et al. | |
| 5,895,263 A | 4/1999 | Carter et al. | |
| 5,900,160 A | 5/1999 | Whitesides et al. | |
| 5,907,782 A | 5/1999 | Wu | |
| 5,912,049 A | 6/1999 | Shirley | |
| 5,926,690 A | 7/1999 | Toprac et al. | |
| 5,937,758 A | 8/1999 | Maracas et al. | |
| 5,942,871 A | 8/1999 | Lee | |
| 5,948,219 A | 9/1999 | Rohner | |
| 5,948,470 A | 9/1999 | Harrison et al. | |
| 5,948,570 A | 9/1999 | Kornblit et al. | |
| 5,952,127 A | 9/1999 | Yamanaka | |
| 6,033,977 A | 3/2000 | Gutsche et al. | |
| 6,035,805 A | 3/2000 | Rust | |
| 6,038,280 A | 3/2000 | Rossiger et al. | |
| 6,039,897 A | 3/2000 | Lochhead et al. | |
| 6,046,056 A | 4/2000 | Parce et al. | |
| 6,051,345 A | 4/2000 | Huang | |
| 6,074,827 A | 6/2000 | Nelson et al. | |
| 6,091,485 A | 7/2000 | Li et al. | |
| 6,096,655 A | 8/2000 | Lee et al. | |
| 6,117,708 A | 9/2000 | Wensel | |
| 6,125,183 A | 9/2000 | Jiawook et al. | |
| 6,128,085 A | 10/2000 | Buermann et al. | |

| | | |
|---|---|---|
| 6,143,412 A | 11/2000 | Schueller et al. |
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,188,150 B1 | 2/2001 | Spence |
| 6,204,922 B1 | 3/2001 | Chalmers |
| 6,218,316 B1 | 4/2001 | Marsh |
| 6,245,581 B1 | 6/2001 | Bonser et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,355,198 B1 | 3/2002 | Kim et al. |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,411,010 B1 | 6/2002 | Suzuki et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,482,742 B1 | 11/2002 | Chou |
| 6,489,068 B1 | 12/2002 | Kye |
| 6,495,624 B1 | 12/2002 | Brown |
| 6,514,672 B2 | 2/2003 | Young et al. |
| 6,518,168 B1 | 2/2003 | Clem et al. |
| 6,534,418 B1 | 3/2003 | Plat et al. |
| 6,541,360 B1 | 4/2003 | Plat et al. |
| 6,561,706 B2 | 5/2003 | Singh et al. |
| 6,565,928 B2 | 5/2003 | Sakamoto et al. |
| 6,632,742 B2 | 10/2003 | Yang et al. |
| 6,635,581 B2 | 10/2003 | Wong |
| 6,646,662 B1 | 11/2003 | Nebashi et al. |
| 6,677,252 B2 | 1/2004 | Marsh |
| 6,696,220 B2 | 2/2004 | Bailey et al. |
| 6,703,190 B2 | 3/2004 | Elian |
| 6,713,238 B1 | 3/2004 | Chou et al. |
| 6,716,767 B2 | 4/2004 | Shih et al. |
| 6,719,915 B2 | 4/2004 | Willson et al. |
| 6,730,256 B1 | 5/2004 | Bloomstein et al. |
| 6,737,202 B2 | 5/2004 | Gehoski et al. |
| 6,743,713 B2 | 6/2004 | Mukherjee-Roy et al. |
| 6,767,983 B1 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0150398 A1 | 10/2002 | Choi et al. |
| 2002/0167117 A1 | 11/2002 | Chou |
| 2003/0080471 A1 | 5/2003 | Chou |
| 2003/0081193 A1 | 5/2003 | White et al. |
| 2003/0113638 A1 | 6/2003 | Mancini et al. |
| 2003/0129542 A1 | 7/2003 | Shih et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0029041 A1 | 2/2004 | Shih et al. |
| 2004/0036201 A1 | 2/2004 | Chou et al. |
| 2004/0053146 A1 | 3/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0124566 A1 | 7/2004 | Sreenivasan et al. |
| 2004/0141163 A1 | 7/2004 | Bailey et al. |
| 2004/0141168 A1 | 7/2004 | Sreenivasan et al. |
| 2004/0149687 A1 | 8/2004 | Choi et al. |
| 2004/0163563 A1 | 8/2004 | Sreenivasan et al. |
| 2004/0168586 A1 | 9/2004 | Bailey et al. |
| 2004/0168588 A1 | 9/2004 | Choi et al. |
| 2004/0168613 A1 | 9/2004 | Nguyen |
| 2004/0169441 A1 | 9/2004 | Choi et al. |
| 2004/0170770 A1 | 9/2004 | Nguyen |
| 2004/0170771 A1 | 9/2004 | Bailey et al. |
| 2004/0188381 A1 | 9/2004 | Sreenivasan et al. |
| 2004/0189994 A1 | 9/2004 | Sreenivasan et al. |
| 2004/0189996 A1 | 9/2004 | Sreenivasan et al. |
| 2004/0200411 A1 | 10/2004 | Willson et al. |
| 2004/0202865 A1 | 10/2004 | Homola et al. |
| 2004/0209177 A1 | 10/2004 | Sreenivasan et al. |

FOREIGN PATENT DOCUMENTS

| | | |
|---|---|---|
| DE | 19648844 | 9/1997 |
| EP | 244884 | 3/1987 |
| EP | 733455 | 9/1996 |
| JP | 55-88332 | 7/1980 |
| JP | 57-7931 | 1/1982 |
| JP | 63-138730 | 6/1988 |
| JP | 1-196749 | 8/1989 |
| JP | 02-24848 | 1/1990 |
| JP | 02-92603 | 4/1990 |
| JP | 03-090345 | 4/1991 |
| JP | 09-278490 | 10/1997 |
| WO | WO 92/17883 | 10/1992 |
| WO | WO 98/10121 | 3/1998 |
| WO | WO 99/45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/69317 | 9/2001 |
| WO | WO 01/79589 | 10/2001 |
| WO | WO 01/79592 | 10/2001 |
| WO | WO 01/90816 | 11/2001 |
| WO | WO 2004/044651 | 5/2004 |

OTHER PUBLICATIONS

Hirai et al, Journal of Photopolymer Science and Technology, 14(3), 457-462, 2001.*

Huang et al, J. Vac. Sci. Technol. B, 20(6), pp. 2872-2876, 2003.* translation of JP61-040845, Feb. 1986.*

Gokan et al., "Dry Etch Resistance of Organic Materials," J. Electrochem. Soc. 130:1, 143-146 (Jan. 1983).

Lin, "Multi-Layer Resist Systems", Introduction of Microlithography, American Chemical Society, 1983, pp. 287-350, IBM T.J. Watson Research Center, Yorktown Heights, New York 10598.

Cowie, "Polymers: Chemistry and Physics of Modern Materials," 1991, pp. 408-409, 2nd Ed, Chapman and Hall, a division of Routledge, Chapman and Hall, Inc., 29 West 35th Street, NY, NY 10001-2291.

Krug et al., "Fine Patterning of Thin Sol-Gel Films," Journal of Non-Crystalline Solids, 1992, pp. 447-450, vol. 147 & 148.

Kotachi et al., "Si-Containing Positive Resist for ArF Excimer Laser Lithography," PhotopolymerSci. Tevhnol. 8(4) 615-622, 1995.

Krauss et al., "Fabrication of Nanodevices Using Sub-25nm Imprint Lithography," Appl. Phys. Lett 67(21), 3114-3116, 1995.

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Haisma et al., "Mold-Assisted Nanolithography: A Process for Reliable Pattern Replication," Journal of Vaccum Science and Technology, Nov./Dec. 1996, pp. 4124-4128, vol. B 14(6).

Chou et al., "Imprint Lithography with Sub-10nm Feature Size and High Throughput," Microelectronic Engineering, 1997, pp. 237-240, vol. 35.

Scheer et al., "Problems of the Nanoimprinting Technique for Nanometer Scale Pattern Definition," Journal of Vaccum Science and Technology, Nov./Dec. 1998, pp. 3917-3921, vol. B 16(6).

Xia et al., "Soft Lithography," Annu. Rev. Mater. Sci., 1998, pp. 153-184, vol. 28.

Xia et al., "Soft Lithography," Agnew. Chem. Int. Ed., 1998, pp. 550-575, vol. 37.

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Choi et al., "Design of Orientation Stages for Step and Flash Imprint Lithography," Precision Engineering, Journal of the International Societies for Precision Engineering and Nanotechnology, 2001, pp. 192-199, vol. 25.

Chou, "Nanoimprint Lithographically Induced Self-Assembly," MRS Bulletin, Jul. 2001, pp. 512-517.

Choi et al.; "High Precision Orientation Alignment and Gap Control Stages for Imprint Lithography Processes," U.S. Appl. No. 09/698,317, filed with USPTO on Oct. 27, 2000.

Sreenivasan et al., "High-Resolution Overlay Alignment Methods and Systems for Imprint Lithography," U.S. Appl. No. 09/907,512, Filed with USPTO on Jul. 16, 2001.

Choi et al., "Method and System of Automatic Fluid Dispensing for Imprint Lithography Processes," U.S. Appl. No. 09/908,455, Filed with USPTO on Jul. 17, 2001.

Choi et al., "Methods for High-Precision Gap and Orientation Sensing Between a Transparent Template and Substrate for Imprint Lithography," U.S. Appl. No. 09/920,341, Filed with USPTO on Aug. 1, 2001.

Nguyen, A.Q., "Asymmetric Fluid-Structure Dynamics in Nanoscale Imprint Lithography," University of Texas at Austin, Aug. 2001.

Choi et al., "Flexture Based Macro Motion Translation Stage," U.S. Appl. No. 09/934,248, Filed with USPTO on Aug. 21, 2001.

Bailey et al., "Template for Room Temperature Low Pressure Micro- and Nano-Imprint Lithography," U.S. Appl. No. 09/976,681, Filed with USPTO on Oct. 12, 2001.

Voisin, "Methods of Manufacturing a Lithography Template," U.S. Appl. No. 10/136,188, Filed with USPTO on May 1, 2002.

Willson et al., "Method and System for Fabricating Nanoscale Patterns in Light Curable Compositions Using an Electric Field," U.S. Appl. No. 09/905,718, Filed with USPTO on May 16, 2002.

Watts et al., "Low Viscosity High Resolution Patterning Material," U.S. Appl. No. 10/178,947, Filed with USPTO on Jun. 24, 2002.

Nguyen et al., "Composition And Method To Form A Release Layer," U.S. Appl. No. 10/375,832. Filed with USPTO on Feb. 27, 2003.

Choi et al., "Method To Reduce Adhesion Between A Conformable Region And A Pattern Of A Mold," U.S. Appl. No. 10/463,396. Filed with USPTO on Jun. 17, 2003.

Nguyen et al., "Low Surface Engery Templates," U.S. Appl. No. 10/687,519. Filed with USPTO on Oct. 16, 2003.

Sung, In-Ha et al., "Micro/nano-tribological characteristics of self-assembled monolayer and its application in nano-structure fabrication," Elsevier Science B.V., WEAR 255 (2003) 808-818 [online] URL: www.sciencedirect.com.

(Abstract) Sung, In-Ha et al., "Micro/nano-tribological characteristics of self-assemled monolayer and its application and its application in nano-structure fabrication," Elsevier Science B.V., WEAR 255 (2003) 808-818 [online] URL: www.sciencedirect.com.

Papirer, Eugene et al., "The Grafting of Perfluorinated Silanes onto the Surface of Silica: Characterization by Inverse Gas Chromatography," Journal of Colloid and Interface Science 159, Academic Press, Inc., (1993) 238-242.

(Abstract) Papirer, Eugene et al., "The Grafting of Perfluorinated Silanes onto the Surface of Silica: Characterization by Inverse Gas Chromatography," Journal of Colloid and Interface Science 159, Academic Press, Inc., (1993) 238-242.

Abstract of Japanese Patent 02-24848, Jan. 26, 1990.

Abstract of Japanese Patent 02-92603, Aug. 12, 2004.

Abstract of Japanese Patent 55-88332, Apr. 14, 2004.

Abstract of Japanese Patent 57-7931, Apr. 14, 2004.

Abstract of Japanese Patent 63-138730, Apr. 14, 2004.

Ananthasuresh et al., "Strategies for Systematic Synthesis of Compliant Mems.", DSC-vol. 55-2, Dynamic Systems and Control: vol. 2, pp. 677-686, Nov. 1, 1994.

Arai et al., "Calibration and Basic Motion of Micro Hand Module.", IEEE, Jan. 1, 1993, pp. 1660-1665.

Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145-149.

Bailey et al., "Imprint Lithography Templates having Alignment Marks," U.S. Appl. No. 10/666,527, Filed with USPTO Sep. 18, 2003.

Bender et al., "Multiple Imprinting in UV-based Nanoimprint Lithography: Related Material Issues.", Microelectronic Engineering 61-62, Jan. 1, 2002, pp. 407-413.

Cherala et al., "Applying Imprinting Material to Substrates Employing Electromagnetic Fields," U.S. Appl. 10/687,562, Filed with USPTO Oct. 16, 2003.

Chou, Ultrafast and Direct Imprint of Nanostructures in Silicon, Nature, col. 417, (Jun. 2002), pp. 835-837.

Feldman et al., "Wafer Chuck Magnification Correction in X-Ray Lithography.", J. Vac. Sci. Technol. B 16(6), Nov. 1, 1998, pp. 3476-3479.

Feynman, "There's Plenty of Room at the Bottom.", International Appl. No. PCT/US2002/015551.

Goldfarb et al., "Compliant Micromanipulator Design for Scaled Bilateral Telemanipulation of Small-Scale Environments.", ASME International Mechanical Engineering Conference and Exposition, Nov. 1, 1998, DSC-vol. 64, pp. 213-218.

Hashimoto et al., "Design and Characteristics of a Parallel Link Complaint Wrist." IEEE, May 1, 1994, Department of Mechanical Engineering, Kagoshiam University, pp. 2457-2462.

Heidari, "Nanoimprint Lithography at the 6 in. Wafer Scale.", J. Vac. Sci. Technol. B 18 (6), Nov. 1, 2000, pp. 3557-3560.

*Hexel Coporation, "Tornado 2000 System Specifications.",* www.hexel.com, Nov. 12, 1999.

Hogan et al., "Impedance Control: An Approach to Manipulation: Part 1- Theory.", Journal of Dynamic Systems, Measurement, and Control, Mar. 1, 1985, vol. 107, pp. 1-7.

Hollis et al., "A Six-Degree-of-Freedom Magnetically Levitated Variable Compliance Fine-Motion Wrist: Design, Modeling, and Control.", IEEE Transactions on Robotics and Automation, Jun. 1, 1991, vol. 7., No. 3, pp. 320-332.

Howell et al., "A Loop-Closure Theory for the Analysis and Synthesis of Compliant Mechanisms.", Journal of Mechanical Design, Mar. 1, 1996, vol. 188, pp. 121-125.

Hu et al., "Fluorescence Probe Techniques (FPT) for Measuring the Relative Efficiencies of Free-Radical Photoinitiators.", Macromolecules, May 29, 1998, 31, pp. 4107-4113.

International Application No. PCT/US2002/015551, Communication Relating to the Results of the Partial International Search.

International Search Report for PCT/US 00/30041, Oct. 18, 2001.

International Search Report for PCT/US 01/26049, Feb. 19, 2002.

Johnson et al., "Advances in Step and Flash Imprint Lithography.", SPIE Microlithography Conference, Feb. 23, 2003.

Kanetomo et al., "Robot for Use in Ultrahigh Vacuum.", Solid State Technology, Aug. 1, 1997, pp. 63-72.

Kim et al., "Surface Energy and Polarity of Treated Indium-Tin-Oxide Anodes for Polymer Light-Emittng Diodes Studied by Contact Angle Measurements." Journal of Applied Physics 1999, pp. 2774-2778, vol. 86, No. 5.

Kim et al., "High-precision Magnetic Levitation Stage for Photolithography.", Precision Engineering, Apr. 1, 1998, vol. 22, No. 2, pp. 66-77.

Koseki, "Design and Accuracy Evaluation of High-Speed and High Precision Parallel Mechanism.", Proc. Of IEEE, Jan. 1, 1998, Intl. Conf. on Robotics & Automation, pp. 1340-1345.

Lee et al., "An Ultraprecision Stage for Alignment of Wafers in Advanced Microlithography.", Precision Engineering, Sep. 1, 1997, pp. 113-122.

Lee et al., "Ultra Precision Positioning System for Servo Motor-piezo Actuator Using the Dual Servo Loop and Digital filter Implementation.", American Society for Precision Engineering, Jan. 1, 1998, pp. 287-290.

Lucas Aerospace, Free-Flex® Pivot Catalog, Jan. 1, 1999.

Mansky et al., "Large-Area Domain Alignment in Block Copolymer Thin Films Using Electric Fields.", Macromolecules, Jun. 9, 1998, vol. 31, No. 13, pp. 4399-4401.

McMackin et al., "A Method of Creating a Turbulent Flow of Fluid between a Mold and a Substrate," U.S. Appl. No. 10/898,034, Filed USPTO Jul. 23, 2004.

McMackin et al., "A System of Creating a Turbulent Flow of Fluid between a Mold and a Substrate," U.S. Appl. No. 10/898,037, Filed with USPTO Jul. 23, 2004.

McMackin et al., Single Phase Fluid Imprint Lithography Method, U.S. Appl. No. 10/677,639, Filed with USPTO Oct. 16, 2003.

Merlet, "Parallel Manipulators: State of the Art and Perspectives.", Advanced Robotics, Jan. 1, 1994, vol. 8, pp. 589-596.

Mirkin et al., "Emerging Methods for Micro-and-Nanofabrication.", MRS Bulletin, Jul. 1, 2001, pp. 506-509.

Mittal, "Precision Motion Control of a Magnetic Suspension Actuator Using a Robust Nonlinear Compensation Scheme.", IEE/ASME Transactions on Mechatronics., Dec. 1, 1997, vol. 2, No. 4, pp. 268-280.

Nerac.com Retro Search, "Multi-Layer Resists.", Sep. 2, 2004.

Nerac.com Retro Search, "Reduction of Dimension of Contact Holes.", Aug. 31, 2004.

Nerac.com Retro Search, "Trim Etching of Features Formed on an Organic Layer.", Sep. 2, 2004.

Ohya et al., "Development of 3-DOF Finger Module for Micro Manipulation.", Proc. of IEEE, Mar. 1, 1999, Intl. Conf. on Intelligent Robots and Systems, pp. 894-899.

Otto et al., "Step and Repeat UV-Nanoimprint Lithography: Material Issues.", NNT02 San Francisco, Dec. 11, 2002.

Parikh et al., "An Intrinsic Relationship between Molecular Structure in Self-Assembled n-Alkysiloxane Monolayers and Deposition Temperature," Journal of Phys. Chem., pp. 7577-7590, 1994.

Paros et al., "How to design Flexure Hinges.", Machine Design, Nov. 25, 1965, pp. 151-156.

Peng et al., "Compliant Motion Control of Kinematically Redundant Manipulators.", IEEE Transactions on Robotics and Automation, Dec. 1, 1993, vol. 9, No. 6, pp. 831-837.

Pernette et al., "Design of Parallel Robots in Microbotics.", Robotica, Jan. 1, 1997, vol. 15, pp. 417-420.

Physik Instruments, PI Online-Catalog, 1999, from www.physikinstruments.com.

Physik Instruments, Product Catalog for Micropositioning, 1997.

Raibert et al., "Hybrid Position/Force Control of Manipulators.", Journal of Dynamic Systems, Measurement, and Control, Jun. 1, 1981, vol. 102, pp. 126-133.

Rong et al., "Design and Analysis of Flexure-Hinge Mechanism Used in Micro-Positioning Stages.", ASME, Jan. 1, 1994, vol. 2, pp. 979-985.

Rong et al., "Dynamics of Parallel Mechanism with Direct Compliance Control.", IEEE, Jan. 1, 1997, pp. 1753-1758.

Sagiv, J., "Organized Monolayers by Adsorption. 1. Formation and Structure of Oleophobic Mixed Monolayes and Solid Surfaces," Journal of the American Chemical Society, vol. 102, pp. 92-98, Jan. 2, 1980.

Slocum, "Precision Machine Design: Macromachine Design Philosophy and Its Applicability to the Design of Micromachines.", Micro Electro Mechanical Systems, Feb. 4, 1992.

Sowah, Diamond Used to Break the Mould [online], Sep. 18, 2002, [Retrieved on Sep. 2, 2003.] Retrieved from the Internet: <URL: http: Http://eetuk.com/showArticle.jhtml?articleID=19203691>.

Sreenivasan et al., "A Conforming Template for Patterning Liquids Disposed on Substrates." U.S. Appl. No. 10/614,716. Filed with USPTO on Jul. 7, 2003.

Sreenivasan et al., "An Imprint Lithography System to Produce a Light to Impinge upon and Polymerize a Liquid in Superimposition with Template Overlay Marks," U.S. Appl. No. 10/864,214 filed with USPTO Jun. 9, 2004.

Srinivasan et al.,"Alkyltrichlorosilane-Based Self-Assembled Monolayer Films for Stiction Reduction in Silicon Micromachines," Journal of Microelectromechanical Systems, vol. 7, No. 2, p. 252-260, Jun. 1, 1998.

Stewart, "A Platform With Six Degrees of Freedom.", Proc Instn Mech Engrs, May 28, 1965, vol. 180, Pt1, No. 15, pp. 371-378.

Tajbakhsh et al., "Three-Degree-of-Freedom Optic Mount for Extreme Ultraviolet.", American Society for Precision Engineering, Jan. 1, 1998, pp. 359-362.

Tanikawa et al., "Development of Small-sized 3 DOF Finger Module in Micro Hand for Micro Manipulation.", Proc. of IEEE, Mar. 1, 1999, Intl. cof. on Intelligent Robots and Systems, pp. 876-881.

Translation of Japanese Patent 02-24848, Jan. 26, 1990.

Translation of Japanese Patent 02-92603, Apr. 3, 1990.

Trilogy Systems, "Linear Motors 310.", wwww.trilogysystems.com, Jan. 1, 2001.

U.S. Appl. No. 10/463,396, filed Jun. 17, 2003, Choi et al., "Method to Reduce Adhesion Between a Conformable Region and a Pattern of a Mold."

U.S. Appl. No. 10/735,110, filed Dec. 12, 2003, Nimmakayala et al., "Magnification Correction Employing Out-of-Plane Distortion of a Substrate."

U.S. Appl. No. 10/785,248, filed Feb. 24, 2004, Choi et al., "A Method to Control the Relative Position Between a Body and a Surface."

U.S. Appl. No. 10/788,700, filed Feb. 27, 2004, Sreenivasan et al., "Full-Wafer of Large Area Imprinting with Multiple Separated Sub-Fields for High Throughput Lithography."

U.S. Appl. No. 10/806,956, filed Mar. 23, 2003, Choi et al., "An Apparatus to Control Displacement of a Body Spaced-Apart from a Surface."

U.S. Appl. No. 10/194,991, filed Jul. 11, 2002, Sreenivasan et al., "Step and Repeat Lithography Processes."

U.S. Appl. No. 10/687,519, filed Oct. 16, 2003, Nguyen et al., "Low Surfaced Energy Template."

Vanderbilt University Office of Transfer Technology; VU9730 Specifications for Improved Flexure Device: 2001, 25, 192-199.

Wang et al., "Passive Compliance versus Active Compliance in Robot-Based Automated Assembly Systems.", Industrial Robot, Jan. 1, 1998, vol. 25, No. 1, pp. 48-57.

Williams et al., "Six Degree of Freedom Mag-Lev Stage Development.", SPIE, Jan. 1, 1997, vol. 3051, pp. 856-867.

Willson et al., "Step and Flash Imprint Lithography", U.S. Appl. No. 10/806,051, filed with USPTO Mar. 22, 2004.

Wu, "Large Area High Density Quantized Magnetic Disks Fabricated Using Nanoimprint Lithography.", J. Vac. Sci. Technol., Nov. 1, 1998, B 16(6), pp. 3825-3829.

Xu et al., "Materials for Imprint Lithography," U.S. Appl. No. 10/784,911, filed with USPTO Feb. 23, 2004.

Xu et al., Methods for Fabricating Patterned Features Utilizing Imprint Lithography,: U.S. Appl. No. 10/694,284, filed with USPTO Oct. 27, 2003.

English Language Abstract of JP 03-090345, Apr. 16, 1991.

English Language Abstract of JP 09-278490, Oct. 28, 1997.

English Language Abstract of JP 61040845, Feb. 27, 1986.

English Language Translation of JP 61040845, Feb. 27, 1986.

English Language Abstract of JP 02248480, Oct. 4, 1990.

English Language Translation of JP 02248480, Oct. 4, 1990.

* cited by examiner

METHOD TO REDUCE ADHESION BETWEEN A POLYMERIZABLE LAYER AND A SUBSTRATE EMPLOYING A FLUORINE-CONTAINING LAYER

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat No. 6,334,960 to Willson et al. Willson et al. disclose a method of forming a relief image in a structure. The method includes providing a substrate having a transfer layer. The transfer layer is covered with a polymerizable fluid composition. An imprint device makes mechanical contact with the polymerizable fluid. The imprint device includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the imprint device. The imprint device is then separated from the solid polymeric material such that a replica of the relief structure in the imprint device is formed in the solidified polymeric material. The transfer layer and the solidified polymeric material are subjected to an environment to selectively etch the transfer layer relative to the solidified polymeric material such that a relief image is formed in the transfer layer.

An important characteristic with accurately forming the pattern in the polymeric material is to reduce, if not prevent, adhesion of the polymeric material, and/or, transfer layer, to the imprint device. These are referred to as release characteristics. In this manner, the pattern recorded in the polymeric material and/or transfer layer, is not distorted during. separation of the imprint device therefrom. To improve the release characteristics, Willson et al. form a release layer on the surface of the imprint device. The release layer adheres to the imprint device and to either the transfer layer or the polymeric material. Providing the transfer layer with improved release characteristics minimizes distortions in the pattern recorded into the polymeric material and/or the transfer layer that are attributable to imprint device separation.

It is desired, therefore, to improve the release characteristics of an imprint device employed in imprint lithography processes.

SUMMARY OF THE INVENTION

The present invention provides a method to reduce adhesion between a polymerizable layer and a substrate surface that selectively comes into contact with the polymerizable layer. The method features disposing a coating upon the surface from a composition having a perfluoro silane containing molecule. The surface includes bonding regions and the perfluoro silane molecule is connected to bonding region forming covalent bonding groups, as well as defining contact regions. The contact regions include fluorinated chains of molecules. The covalent bonding groups are positioned between the surface and the contact regions. In other embodiments, the perfluoro silane containing molecule is applied to the surface as a monomolecular layer. The perfluoro silane containing molecule may be formed from a di-functional perfluoro silane molecule, which forms a wetting angle, with respect to the surface, in a range of 90°-115°. Exemplary molecules that may be employed as the perfluoro silane containing molecule includes molecules sold under the tradenames FLUOROSYL™ FSD 2500 and FLUOROSYL™ FSD 4500, which are available from Cytonix Corporation located in Beltsville, Md. These and other embodiments are described herein.

DETAILED DESCRIPTION OF THE PREFERRED EMBODIMENTS

Figure 1:
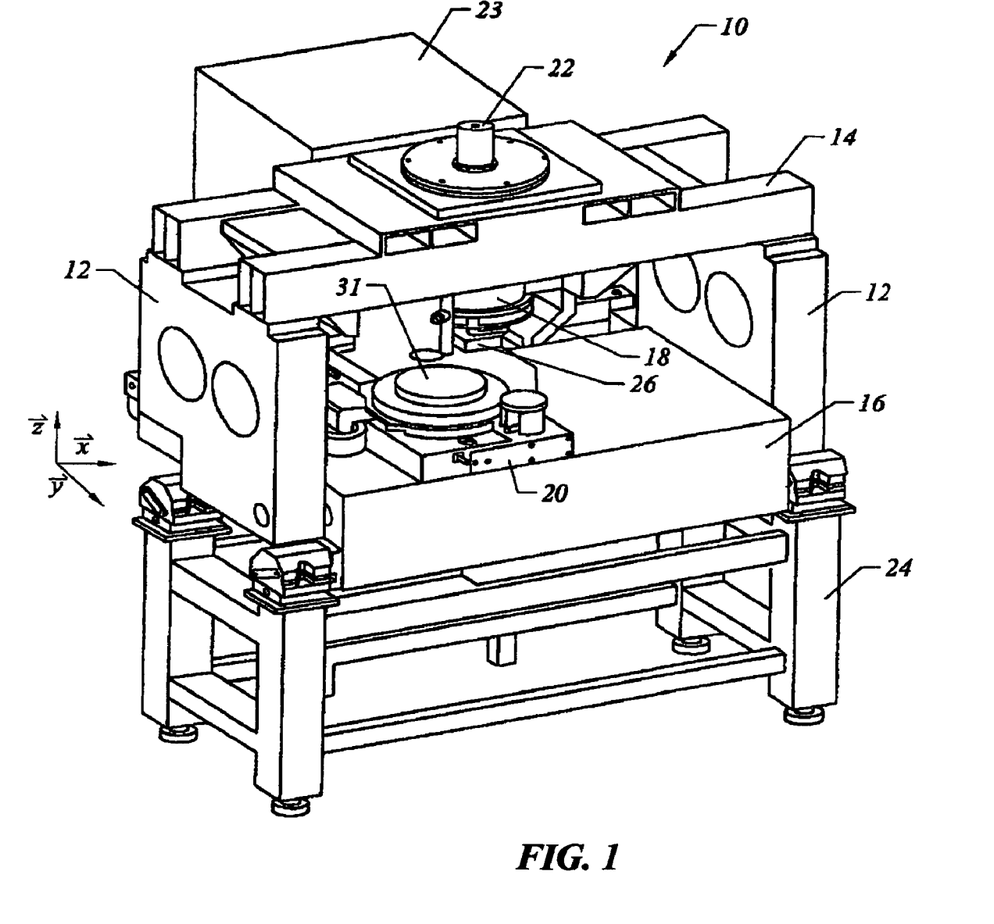
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
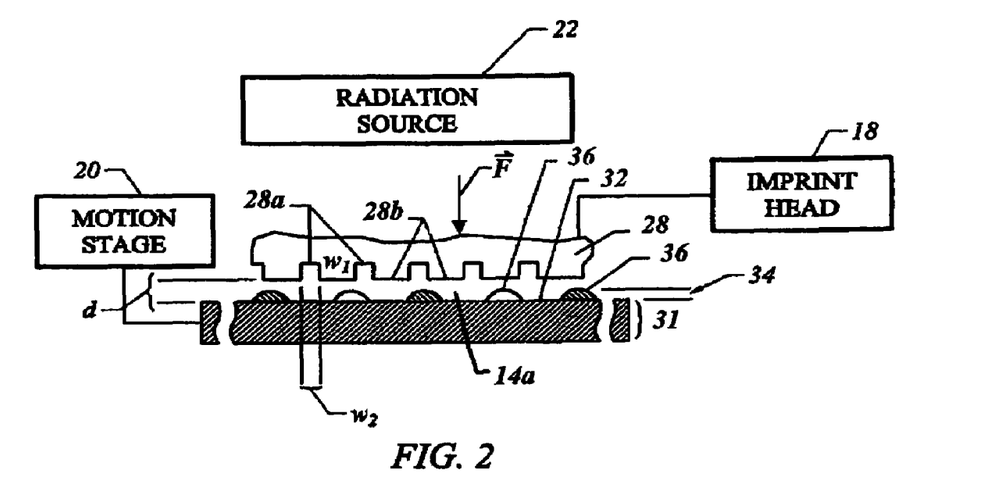
FIG. 2 is a simplified elevation view of a lithographic system shown in FIG. 1.

Referring to both Figs. 1 and 2, connected to imprint head 18 is a substrate 26 having an imprint device 28 thereon. Imprint device 28 includes a plurality of features defined by a plurality of spaced-apart recessions 28a and protrusions 28b. The plurality of features defines an original pattern that is to be transferred into a wafer 31 positioned on motion stage 20. To that end, imprint head 18 is adapted to move along the Z axis and vary a distance "d" between imprint device 28 and wafer 31. In this manner, the features on imprint device 28 may be imprinted into a flowable region of wafer 31, discussed more fully below. Radiation source 22 is located so that imprint device 28 is positioned between radiation source 22 and wafer 31. As a result, imprint device 28 is fabricated from material that allows it to be substantially transparent to the radiation produced by radiation source 22.

Figure 3:
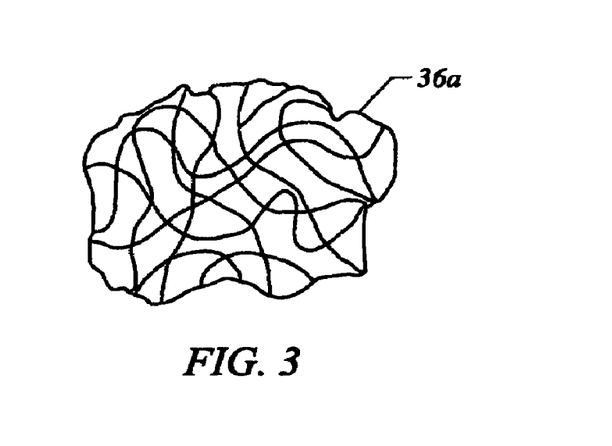
FIG. 3 is a simplified representation of material from which an imprinting layer, shown in FIG. 2, is comprised before being polymerized and cross-linked.

Referring to both FIGS. 2 and 3, a flowable region, such as an imprinting layer 34, is disposed on a portion of surface 32 that presents a substantially planar profile. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835-837, June 2002. In the present embodiment, however, flowable region consists of imprinting layer 34 being deposited as a plurality of spaced-apart discrete beads 36 of material 36a on wafer 31, discussed more fully below. Imprinting layer 34 is formed from a material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
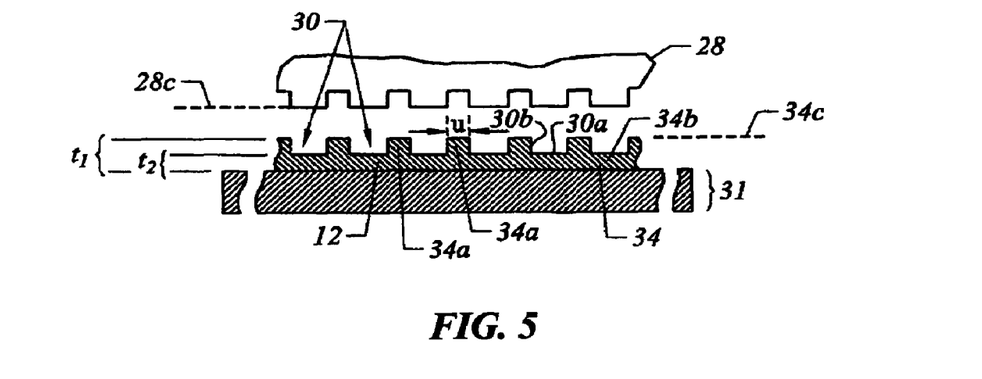
FIG. 5 is a simplified elevation view of an imprint device spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with imprint device 28. To that end, imprint head 18 reduces the distance "d" to allow imprinting layer 34 to come into mechanical contact with imprint device 28, spreading beads 36 so as to form imprinting layer 34 with a contiguous formation of material 36a over surface :32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a while covering surface 32 with a contiguous formation of material 36a. In the present embodiment, sub-portions 34b of imprinting layer 34 in superimposition with protrusions 28b remain after the desired, usually minimum distance "d", has been reached, leaving sub-portions 34a with a thickness $t_1$, and sub-portions 34b with a thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \leq 2u$, shown more clearly in FIG. 5.

Figure 4:
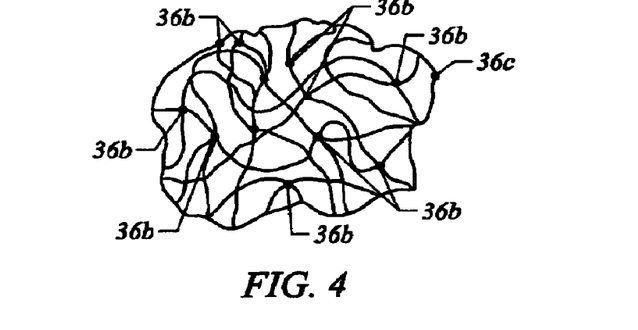
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming cross-linked polymer material 36c. As a result, the composition of imprinting layer 34 transforms from material 36a to material 36c, which is a solid. Specifically, material 36c is solidified to provide side 34c of imprinting layer 34 with a shape conforming to a shape of a surface 28c of imprint device 28, shown more clearly in FIG. 5, with imprinting layer 34 having recesses 30. After imprinting layer 34 is transformed to consist of material 36c, shown in FIG. 4, imprint head 18, shown in FIG. 2, is moved to increase distance "d" so that imprint device 28 and imprinting layer 34 are spaced-apart.

Referring to FIG. 5, additional processing may be employed to complete the patterning of wafer 31. For example, wafer 31 and imprinting layer 34 may be etched to transfer the pattern of imprinting layer 34 into wafer 31, providing a patterned surface (not shown). To facilitate etching, the material from which imprinting layer 34 is formed may be varied to define a relative etch rate with respect to wafer 31, as desired. The relative etch rate of imprinting layer 34 to wafer 31 may be in a range of about 1.5:1 to about 100:1.

To that end, imprinting layer 34 may be provided with an etch differential with respect to photo-resist material (not shown) selectively disposed thereon. The photo-resist material (not shown) may be provided to further pattern imprinting layer 34, using known techniques. Any etch process may be employed, dependent upon the etch rate desired and the underlying constituents that form wafer 31 and imprinting layer 34. Exemplary etch processes may include plasma etching, reactive ion etching, chemical wet etching and the like.

Figure 6:
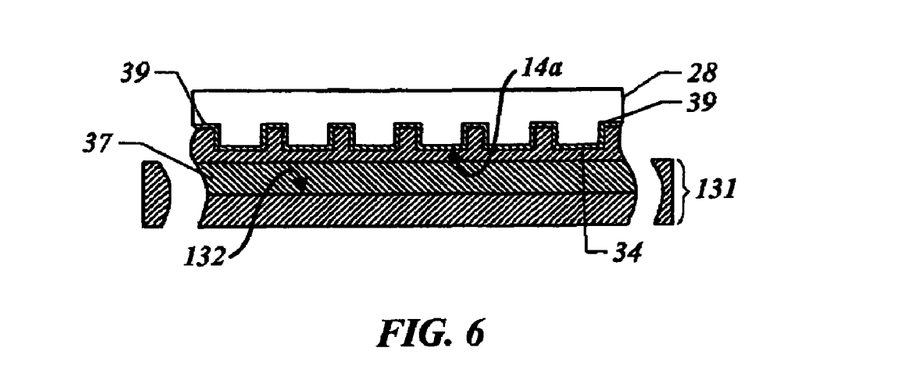
FIG. 6 is a simplified elevation view of material in an imprint device and substrate employed with the present invention in accordance with an alternate embodiment.

Referring to FIGS. 2, 3 and 6, it may be desired to remove residual material (not shown) that may be present on imprinting layer 34 after patterning has been completed. The residual material may consist of un-polymerized material 36a, solid polymerized and cross-linked material 36c, shown in FIG. 4, material from which wafer 31 is formed, shown in FIG. 1, or a combination thereof. Further processing may be included to remove the residual material using well known techniques, e.g., argon ion milling, a plasma etch, reactive ion etching or a combination thereof. Further, removal of the material may be accomplished during any stage of the patterning. For example, removal of the residual material (not shown) may be carried out before etching the polymerized and cross-linked imprinting layer 34.

Referring to both FIGS. 1 and 2 an exemplary radiation source 22 may produce ultraviolet radiation. Other radiation sources may be employed, such as thermal, electromagnetic and the like. The selection of radiation employed to initiate the polymerization of the material in imprinting layer 34 is known to one skilled in the art and typically depends on the specific application which is desired. Furthermore, the plurality of features on imprint device 28 are shown as recessions 28a extending along a direction parallel to protrusions 28b that provide a cross-section of imprint device 28 with a shape of a battlement. However, recessions 28a and protrusions 28b may correspond to virtually any feature required to create an integrated circuit and may be as small as a few tenths of nanometers.

It may be desired to manufacture components of system 10 from materials that are thermally stable, e.g., have a thermal expansion coefficient of less than about 10 ppm/degree centigrade at about room temperature (e.g. 25 degrees Centigrade). In some embodiments, the material of construction may have a thermal expansion coefficient of less than about 10 ppm/degree Centigrade, or less than 1 ppm/degree Centigrade. To that end, bridge supports 12, bridge 14, and/or stage support 16 may be fabricated from one or more of the following materials: silicon carbide, iron alloys available under the trade-name INVAR®, or trade-name SUPER INVAR™, ceramics, including but not limited to ZERODUR® ceramic. Additionally, table 24 may be constructed to isolate the remaining components of system 10 from vibrations in the surrounding environment. An exemplary table 24 is available from Newport Corporation of Irvine, Calif.

Referring to FIGS. 1, 2 and 5, the pattern produced by the present patterning technique may be transferred into wafer 31 to provide features having aspect ratios as great as 30:1. To that end, one embodiment of imprint device 28 has recesses 28a defining an aspect ratio in a range of 1:1 to 10:1. Specifically, protrusions 28b have a width $W_1$ in a range of about 10 nm to about 5000 μm, and recesses 28a have a width $W_2$ in a range of 10 nm to about 5000 μm. As a result, imprint device 28 and/or substrate 26, may be formed from various conventional materials, such as, but not limited to, quartz, silicon, organic polymers, siloxane polymers, borosilicate glass, fluorocarbon polymers, metal, and combinations of the above.

Referring to FIGS. 1, 2 and 3, the characteristics of material 36a are important to efficiently pattern wafer 31 in light of the unique deposition process employed. As mentioned above, material 36a is deposited on wafer 31 as a plurality of discrete and spaced-apart beads 36. The combined volume of beads 36 is such that the material 36a is distributed appropriately over area of surface 32 where imprinting layer 34 is to be formed. As a result, imprinting layer 34 is spread and patterned concurrently, with the pattern being subsequently set by exposure to radiation, such as ultraviolet radiation. As a result of the deposition process it is desired that material 36a have certain characteristics to facilitate rapid and even spreading of material 36a in beads 36 over surface 32 so that the all thicknesses $t_1$ are substantially uniform and all thicknesses $t_2$ are substantially uniform. The desirable characteristics include having a viscosity approximately that of water, ($H_2O$), 1 to 2 centepoise (csp), or less, as well as the ability to wet surface of wafer 31 to avoid subsequent pit or hole formation after polymerization. To that end, in one example, the wettability of imprinting layer 34, as defined by the contact angle method, should be such that the angle, $\theta_1$, is defined as follows:

$$0 > \theta_1 < 75°$$

With these two characteristics being satisfied, imprinting layer 34 may be made sufficiently thin while avoiding formation of pits or holes in the thinner regions, such as sub-portions 34b.

Referring to FIGS. 2, 3 and 5, another characteristic that it is desired for material 36a to possess is thermal stability such that the variation in an angle Φ, measured between a nadir 30a of a recess 30 and a sidewall 30b thereof, does not vary more than 10% after being heated to 75° C. for thirty (30) minutes. Additionally, material 36a should transform to material 36c, shown in FIG. 4, i.e., polymerize and cross-link, when subjected to a pulse of radiation containing less than 5 J cm−2. In the present example, polymerization and cross-linking was determined by analyzing the infrared absorption of the "C═C" bond contained in material 36a. Additionally, it is desired that wafer surface 32 be relatively inert toward material 36a, such that less than 500 nm of surface 32 be dissolved as a result sixty seconds of contact with material 36a. It is further desired that the wetting of imprint device 28 by imprinting layer 34 be minimized. To that end, the wetting angle, $\theta_2$, should be greater than 75°. Finally, should it be desired to vary an etch rate differential between imprinting layer 34 and wafer 31 an exemplary embodiment of the present invention would demonstrate an etch rate that is 20% less than the etch rate of an optical photo-resist (not shown) exposed to an oxygen plasma.

The constituent components that form material 36a to provide the aforementioned characteristics may differ. This results from wafer 31 being formed from a number of different materials. As a result, the chemical composition of surface 32 varies dependent upon the material from which wafer 31 is formed. For example, wafer 31 may be formed from silicon, plastics, gallium arsenide, mercury telluride, and composites thereof. Additionally, wafer 31 may include one or more layers in sub-portion 34b, e.g., dielectric layer, metal layers, semiconductor layer and the like.

Referring to FIGS. 2 and 3, in one embodiment of the present invention the constituent components of material 36a consist of acrylated monomers or methacrylated monomers that are not silyated, a cross-linking agent, and an initiator. The non-silyated acryl or methacryl monomers are selected to provide material 36a with a minimal viscosity, e.g., viscosity approximating the viscosity of water (1-2 cps) or less. The cross-linking agent is included, even though the size of these molecules increases the viscosity of material 36a, to cross-link the molecules of the non-silyated monomers, providing material 36a with the properties to record a pattern thereon having very small feature sizes, on the order of a few nanometers and to provide the aforementioned thermal stability for further processing. To that end, the initiator is provided to produce a free radical reaction in response to radiation, causing the non-silyated monomers and the cross-linking agent to polymerize and cross-link, forming a cross-linked polymer material 36c, shown in FIG. 4. In the present example, a photo-initiator responsive to ultraviolet radiation is employed. In addition, if desired, a silyated monomer may also be included in material 36a to control the etch rate of the result cross-linked polymer material 36c, without substantially affecting the viscosity of material 36a.

Examples of non-silyated monomers include, but are not limited to, butyl acrylate, methyl acrylate, methyl methacrylate, or mixtures thereof. The non-silyated monomer may make up approximately 25 to 60% by weight of material 36a. It is believed that the monomer provides adhesion to an underlying organic transfer layer, discussed more fully below.

The cross-linking agent is a monomer that includes two or more polymerizable groups. In one embodiment, polyfunctional siloxane derivatives may be used as a cross-linking agent. An example of a polyfunctional siloxane derivative is 1,3-bis(3-methacryloxypropyl)-tetramethyl disiloxane. Another suitable cross-linking agent consists of ethylene diol diacrylate. The cross-linking agent may be present in material 36a in amounts of up to 20% by weight, but is more typically present in an amount of 5 to 15% by weight.

The initiator may be any component that initiates a free radical reaction in response to radiation, produced by radiation source 22, impinging thereupon and being absorbed thereby. Suitable initiators may include, but are not limited to, photo-initiators such as 1-hydroxycyclohexyl phenyl ketone or phenylbis(2,4,6-trimethyl benzoyl) phosphine oxide. The initiator may be present in material 36a in amounts of up to 5% by weight, but is typically present in an amount of 1 to 4% by weight.

Were it desired to include silylated monomers in material 36a, suitable silylated monomers may include, but are not limited to, silyl-acryloxy and silyl methacryloxy derivatives. Specific examples are methacryloxypropyl tris(tri-methylsiloxy)silane and (3-acryloxypropyl)tris(tri-methoxysiloxy)-silane. Silyated monomers may be present in material 36a amounts from 25 to 50% by weight. The curable liquid may also include a dimethyl siloxane derivative. Examples of dimethyl siloxane derivatives include, but are not limited to, (acryloxypropyl) methylsiloxane dimethylsiloxane copolymer.

Referring to both FIGS. 1 and 2, exemplary compositions for material 36a are as follows:

COMPOSITION 1 n-butyl acrylate+ (3-acryloxypropyltristrimethyl-
siloxy)silane+1,3-bis(3-methacryloxypropyl)tetram-
ethyldisiloxane

COMPOSITION 2 t-n-butyl acrylate+ (3-acryloxypropyltristrimethyl-
siloxy)silane+Ethylene diol diacrylate

COMPOSITION 3 t-butyl acrylate+methacryloxypropylpentameth-
yldisiloxane+1,3-bis(3-methacryloxypropyl)tetram-
ethyldisiloxane The above-identified compositions also include stabilizers that are well known in the chemical art to increase the operational life, as well as initiators.

Referring to FIGS. 2 and 6, employing the compositions described above in material 36a, shown in FIG. 3, to facilitate imprint lithography is achieved by defining a surface 132 of wafer 131 with a planarization layer 37. The primary function of planarization layer 37 is to ensure that surface 132 is planar. To that end, planarization layer 37 may be formed from a number of differing materials, such as, for example, thermoset polymers, thermoplastic polymers, polyepoxies, polyamides, polyurethanes, polycarbonates, polyesters, and combinations thereof. Planarization layer 37 is fabricated in such a manner so as to possess a continuous, smooth, relatively defect-free surface that may exhibit excellent adhesion to the imprinting layer 34.

Additionally, to ensure that imprinting layer 34 does not adhere to imprint device 28, surface 14a may be treated with a modifying agent. As a result, the imprinting layer 34 is located between planarization layer 37 and the modifying agent. One such modifying agent is a release layer 39. Release layer 39 and other surface modifying agents, may be applied using any known process. For example, processing techniques may include chemical vapor deposition method, physical vapor deposition, atomic layer deposition or various other techniques, brazing and the like.

Figure 7:
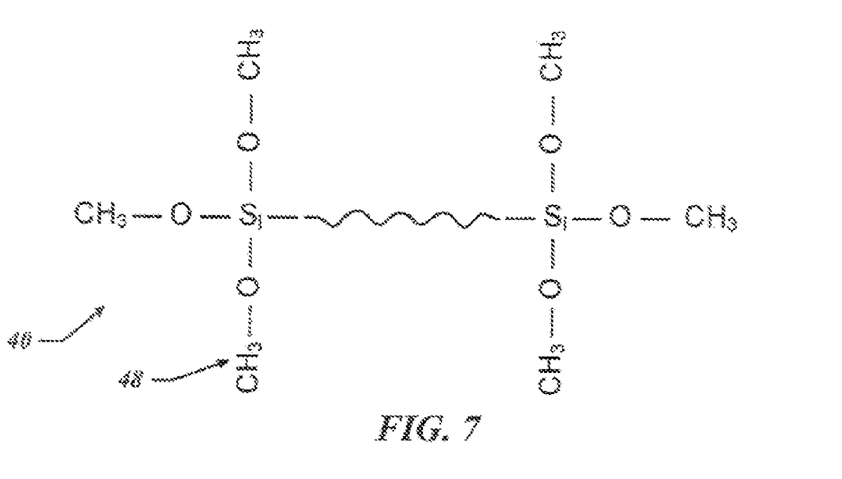
FIG. 7 is a schematic view of a perfluoro silane containing molecule in accordance with a first embodiment of the present invention.
Figure 8:
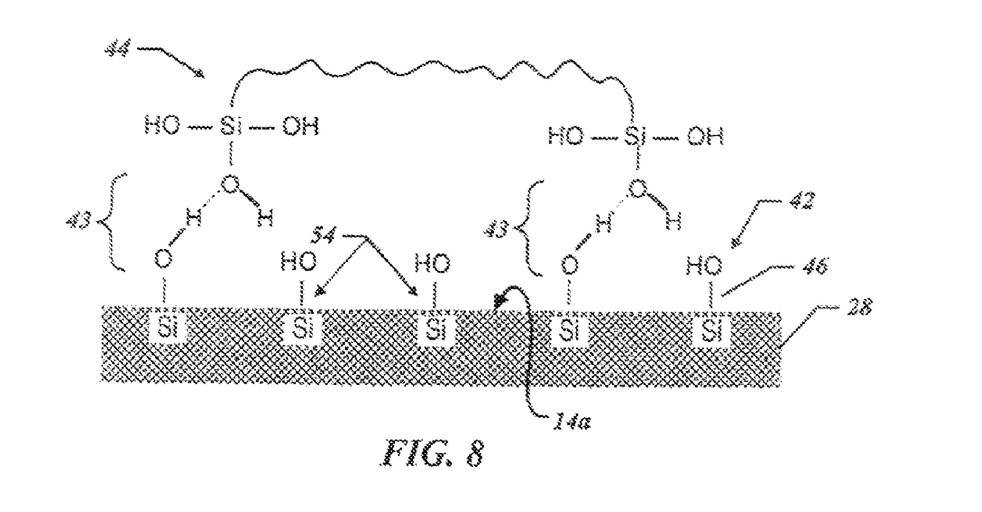
FIG. 8 is a schematic view of the perfluoro silane containing molecule shown in FIG. 7 being bonded to a surface of the imprint device shown in FIGS. 1-6.
Figure 9:
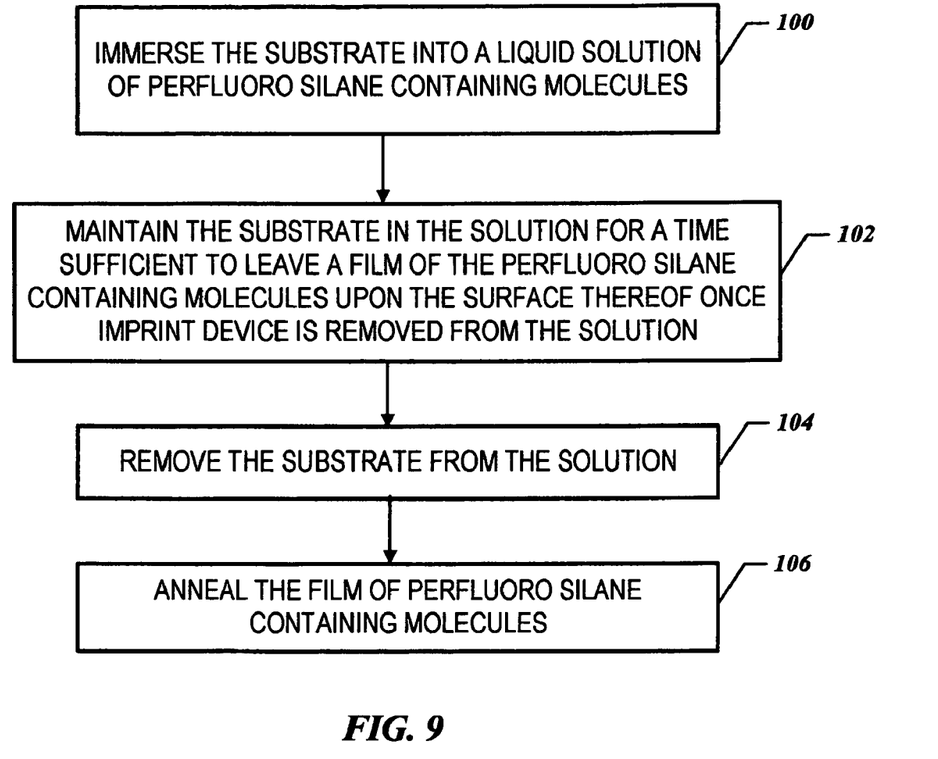
FIG. 9 is a flow diagram describing a process for creating a release layer shown in FIGS. 6-7.

Referring to FIGS. 6, 7 and 8, an exemplary release layer 39 is formed from perfluoro silane containing molecules 40 sold under the trade-names FLUOROSYL™ FSD 2500 and FLUOROSYL™ FSD 4500, which are available from Cytonix Corporation located in Beltsville, Maryland and are perfluoether di-functional trimethoxy silane molecules. The perfluoro silane molecules 40 connect to surface 14a at bonding regions 42 forming covalent bonds included in covalent bonding group 43, as well as defining contact regions 44 that include a chain of fluorine molecules extending between spaced-apart bonding groups 43. Covalent bonding group 43 fixedly attaches di-functional perfluoro silane molecules 40 to surface 14a. Contact regions 44 are positioned to be selectively placed in contact with imprinting layer 34.

Figure 10:
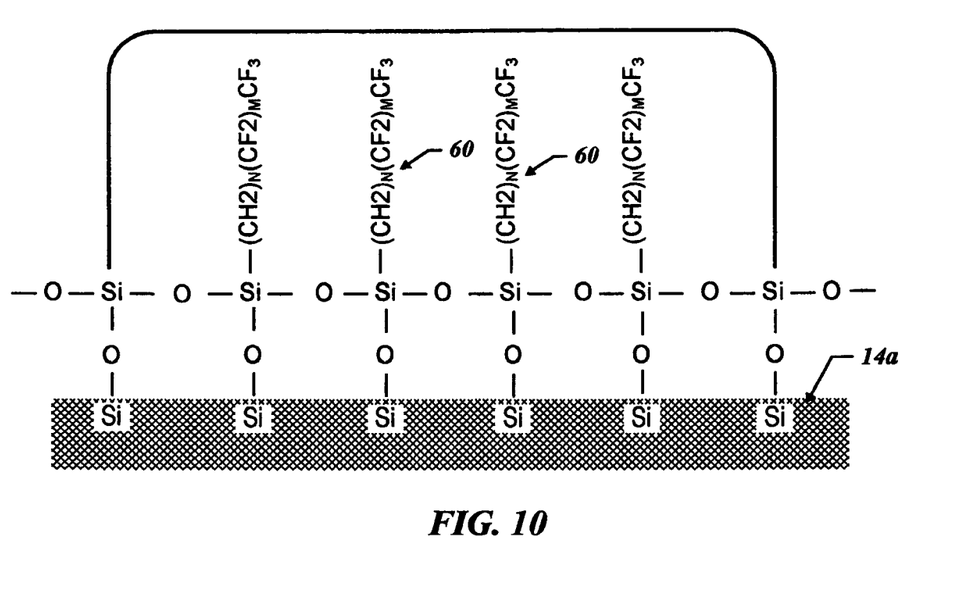
FIG. 10 is a schematic view of the perfluoro silane containing molecule shown in FIG. 7 being bonded to a surface of the imprint device shown in FIGS. 1-6 in accordance with a second embodiment of the present invention.

The chemical characteristics of bonding regions 42 are dependent upon, inter alia, the material from which surface 14a is formed. In the present example, surface 14a is formed from silicon, Si, and typically has a hydroxyl group bonded thereto. The hydroxyl group results from cleaning imprint device 28 with a strong acid-oxidizing solution. As a result, bonding regions 42 include silicon-hydroxyl groups 46. The chemical characteristics of bonding groups 48 of the perfluoro silane containing molecules 40 are also dependent upon the perfluoro silane molecule employed, which, in the present example, is an ethoxyl group. It is believed that groups 46 and groups 48 react to covalently bond perfluoro silane containing molecules 40 to surface 14a through a condensation reaction vis-á-vis formation of covalent bonding groups 43. As illustsrated in FIG. 8. hydrogen binding occurs between the covalent bonding group 43 and the silicon-hdroxyl groups 46. Through the condensation reaction, the covalent bond Si—O—Si is formed. FIG.10 illustrates an Si—O—Si covalent bond that was formed through the condensation reaction.

Referring to FIGS. 1, 6, 7 and 9, one process employed to create release layer 39 includes immersing substrate 26 into a liquid solution (not shown) of perfluoro silane containing molecules 40 at step 100. The solution includes a fluorinated solvent, such as $C_5F_{13}C_2H_4SiCl_3$. The molarity of the perfluoro silane containing molecules 40 in solution is in the range of 0.1 to 1 millimolar. At step 102, substrate 26 remains in the solution for a time sufficient to leave a film of the perfluoro silane containing molecules 40 upon surface 14a once substrate 26 is removed therefrom. In the present example, substrate 26 is immersed into the solution for a period of 1 to 15 minutes. Thereafter, at step 104, substrate 26 is removed from the solution. At step 106, the film of perfluoro silane containing molecules 40 is annealed at a temperature in a range of 100° Celsius to 150° Celsius for a period of time ranging from 20 to 40 minutes. This may be done by placing substrate 26 in an oven or other thermally controlled environment.

With the present process, release layer 39 is formed to have a monomolecular structure, i.e., the thickness of release layer 39 is approximately equal to a length of one molecule of perfluoro silane containing molecules 40. Perfluoro silane containing molecules 40 in release layer 39 form a wetting angle with respect to surface 14a in a range of 90°-115°. The wetting angle is employed as a measure of the suitability of release layer 39. Specifically, were the wetting angle to fall outside of the aforementioned range, release layer 39 would be considered unsuitable for use in imprint lithography. As a result, either imprint device 28 would be discarded or provided with a new release layer 39. As a result, by periodically measuring the wetting angle, the operational life of imprint device 28 may be determined.

Referring to FIG. 8, one manner in which to increase the operational life of imprint device 28 is to form release layer 39 from a mixture of di-functional and mono-functional perfluoro silane containing molecules. It is believed that the characteristics of di-functional molecules results in an undesirable number of unreacted bonding regions, shown as 54. The unreacted bonding regions 54 are often positioned between covalent bonding groups 43 and are, therefore, located between opposed ends of di-functional molecules 40 and surface 14a.

Referring to FIGS. 7, 8 and 10, mono-functional perfluoro silane containing molecules 60 are smaller in size than the di-functional perfluoro silane containing molecules 40. It is believed that the relative smallness of the mono-functional perfluoro silane containing molecules 60 allows the same to attach to silicon groups of un-reacted bonding regions 54. This results in greater coverage of surface 14a of imprint device 28 with perfluoro silane containing molecules.

The mono-functional perfluoro containing molecules 60 may include molecules from the following chemical families: mono-functional perfluoro chlorosilanes, mono-functional perfluoro methoxysilanes, and mono-functional perfluoro ethoxysilanes. Exemplary mono-functional perfluoro containing molecules 60 employed have the following general formula $R_3Si(CH_2)_N(CF_2)_mCF_3$, where $R_3$ is a Cl atom, an $OCH_3$ group, or a $OCH_2CH_3$ group and N and M are integers. A specific example of mono-functional perfluoro containing molecules 60 is tridecafluoro-1,1,2,2-tetrahydrooctyl trichlorosilane and FM660 from Cytnoix Corporation of Beltsville, Md. Release layer 39, shown in FIG. 6, may formed from a mixture of di-functional and mono-functional perfluoro containing molecules and applied to imprint device 28 as described above, with respect to FIG. 9. The liquid solution differs only in that it contains a 1:1. mixture of the di-functional and mono-functional perfluoro silane molecules.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method to reduce adhesion between a polymerizable imprinting layer and an imprint device substrate surface in an imprint lithography process; the imprint device substrate surface having a plurality of bonding regions, said method comprising:

disposing a coating upon said imprint device substrate surface from a composition having a di-functional perfluoro silane containing molecule to provide for attachment to a pair of said bonding regions, with a fluorinated chain of molecules extending therebetween wherein the coating provides for reduced adhesion between the polymerization imprinting layer and the imprint device substrate surface during an imprint lithography process.

2. The method as recited in claim 1 wherein disposing further includes forming said coating from a mono-molecular layer of said perfluoro silane containing molecule.

3. The method as recited in claim 1 wherein disposing further includes forming said perfluoro silane containing molecule from a perfluoroether di-functional trimethoxy silane molecule.

4. The method as recited in claim 1 wherein disposing further includes forming said perfluoro silane containing molecule from a molecule having a formula:

5. The method as recited in claim 1 wherein disposing further includes forming a liquid solution of said composition and placing said substrate into said solution.

6. The method as recited in claim 5 further including removing said substrate from said solution, with said substrate being present in said solution a sufficient time to leave a film of said composition upon said surface after removal from said solution and annealing said film to form said coating.

7. The method as recited in claim 1 further including forming said polymerizable layer from a mono-functional component; a poly-functional molecule component; and an initiator component combined with said mono-functional component.

8. The method as recited in claim 1 further including forming said substrate from quartz and providing said surface with a patterned area.

9. The method a recited in claim 1 further including attaching a mono-functional perfluoro silane containing molecule to a subset of said plurality of bonding regions.

* * * * *